US008009847B2

(12) United States Patent
Planansky

(10) Patent No.: US 8,009,847 B2
(45) Date of Patent: Aug. 30, 2011

(54) HAT WITH MUSIC PLAYER

(76) Inventor: Paul John Planansky, Menifee, CA (US)

( * ) Notice: Subject to any disclaimer, the term of this patent is extended or adjusted under 35 U.S.C. 154(b) by 862 days.

(21) Appl. No.: 12/034,370

(22) Filed: Feb. 20, 2008

(65) Prior Publication Data

US 2009/0208040 A1 Aug. 20, 2009

(51) Int. Cl.
*H01L 25/00* (2006.01)

(52) U.S. Cl. ........ 381/301; 381/333; 381/388; 381/376; 455/575.2; 2/422

(58) Field of Classification Search .................. 381/381, 381/301, 330; 455/575.2; 2/422
See application file for complete search history.

(56) References Cited

U.S. PATENT DOCUMENTS

| | | | | |
|---|---|---|---|---|
| 4,525,878 | A * | 7/1985 | Lowe, Jr. | 2/209.13 |
| 4,858,248 | A * | 8/1989 | Goldsmith et al. | 2/209.13 |
| 5,410,746 | A | 4/1995 | Gelber | |
| 5,881,160 | A * | 3/1999 | Sheppard | 381/376 |
| 7,519,192 | B1 * | 4/2009 | Laycock et al. | 381/301 |
| 2003/0196249 | A1 | 10/2003 | Roberts | |
| 2006/0185062 | A1 | 8/2006 | Peng et al. | |
| 2007/0226876 | A1 | 10/2007 | Foust et al. | |

* cited by examiner

*Primary Examiner* — Roy K Potter

(57) ABSTRACT

This invention is a hat specially configured to carry earphones and a music player equipped with or without an attachment clip. The hat comprises slit-like button-hole openings and grooves in the bill into which the music player clip can be attached, as well as elastic retaining straps to affix the music player and the earphones. Button holes on the hat's surface form together with the headband a conduit that allow the passage, from outside to the inside, of the electrical cables connecting the music player to the earphones. The seam between the headband and the hat is open above the ears of the wearer to allow the retrieval or stowing away of the earphones. The invention also covers a method of listening to music at the option of the user without obstructing surrounding sound by keeping the earphones stowed away in the retaining area formed by the headband.

14 Claims, 10 Drawing Sheets

HAT WITH MUSIC PLAYER

FIELD OF THE INVENTION

The present invention relates to headgears such as hats or caps, more specifically, hats or caps configured to carry music generating devices such as Satellite Receivers (for example, Sirius™ or XM), MP3 players, Nanopods™ or Shuffles™.

BACKGROUND

Advances in electronic miniaturization technology has led to the design of extremely light and compact music players of brands such as the Nanopod™ and the Shuffle™, Satellite Receivers (Sirius™ and XM™) and has made possible the incorporation of these devices into clothing such as headgear. While prior art describes hats configured to hold such music players, the approaches described by previous inventors are far from optimum. At issue with the configurations suggested by the prior art are manufacturing costs, obtrusiveness of the music player and flexibility of its use.

In addition, one of the problems that the prior art does not address is the blocking of environmental sounds by the insertion of earphones into the user's ears. The muffling of sound presents a danger to the user when he drives a car or rides a bicycle. Several states have enacted laws prohibiting the insertion of earphones into ears by users performing these tasks. This invention solves the aforementioned problems.

Several US patents describe systems that incorporate music players in hats. For example U.S. Pat. No. 5,410,746 by Gelber describes a cap capable of carrying an AM/FM radio. In this system the user has only two choices: either he places the earphones in his ears, and therefore hears music but blocks out sounds from his environment; or he stores the earphones in the brim of his hat or bill of his cap, and therefore can hear sounds from his environment but cannot hear any music at all. In addition, the user cannot listen to music without blocking surrounding sounds. Conversely, he cannot listen to surrounding sounds while playing music in the background.

US patent application 2003/0196249 by Roberts incorporates speakers into a ski hat. Cables connect the speakers to the music generator which may be located outside the hat. The cables are cumbersome as they must run from the hat to the music player which would be located in a trouser pocket for example. Again, the user cannot listen to music without blocking surrounding sounds. Conversely, he cannot listen to surrounding sounds while playing music in the background.

US application 2006/0185062 by Peng describes a head mounted MP3 player. This device does not offer any convenient means for storing the earphones and does not allow the user to listen to music in the background or to easily access the player controls.

US application 2007/0226876 by Foust describes a headgear equipped with a pocket for holding a music player. This invention does not allow the user to listen to music in the background, or to easily access the player controls.

Most miniaturized music players today come equipped with a clip for attachment. None of the prior art takes advantage of this clip as a means for attaching the music player to the hat or allows easy access to player controls.

None of the prior art has an anti-theft capability or prevents the loss of the hat and the attached electronics in the event of a strong wind, or attempted theft.

Further features, aspects, and advantages of the present invention over the prior art will be more fully understood when considered with respect to the following detailed description claims and accompanying drawings.

SUMMARY OF THE INVENTION

Figure 1:
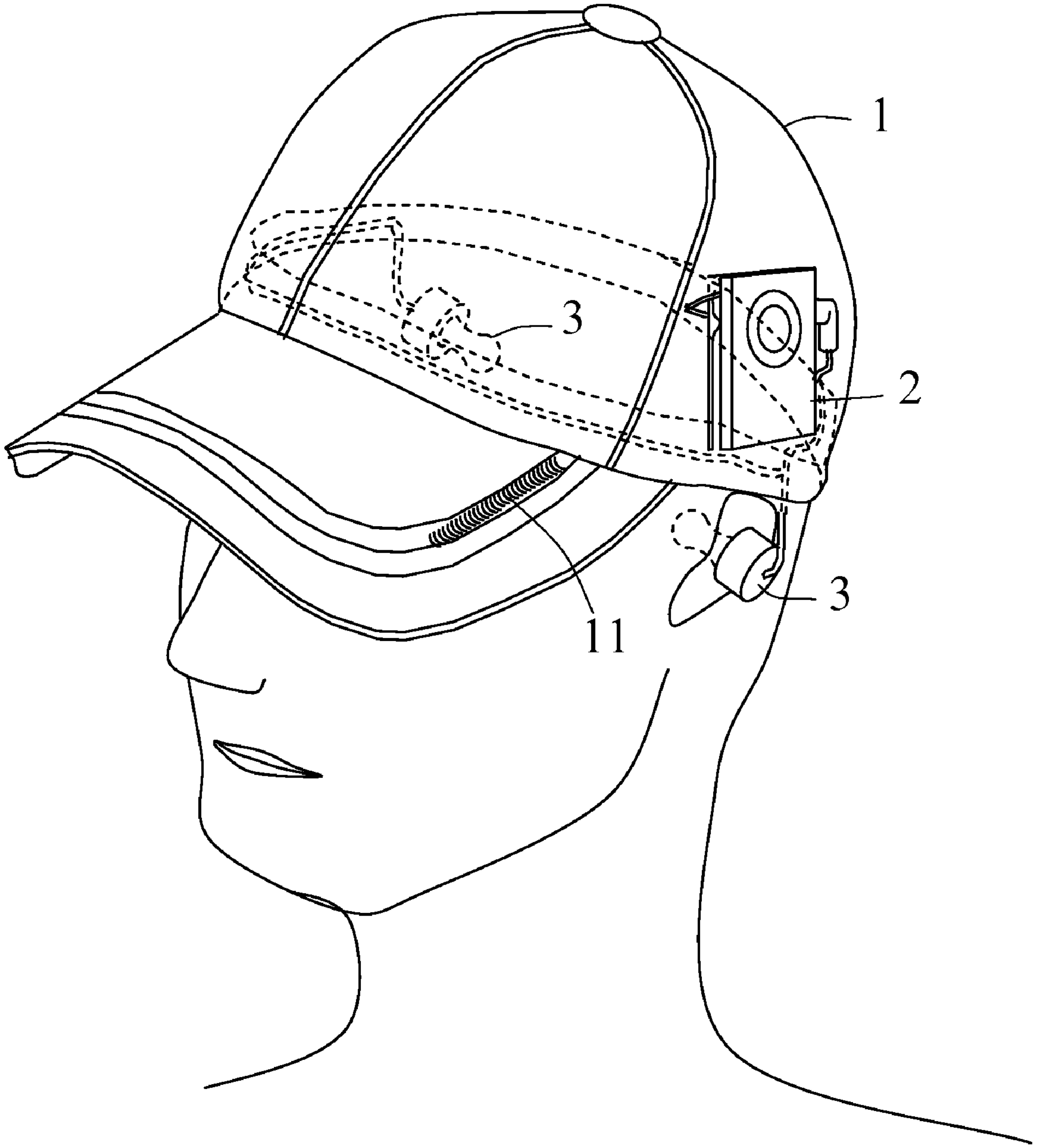
FIG. 1 illustrates how the invention is used. A music player is clipped on a hat through a button hole on the side of the hat.

This invention is a hat specially configured to carry a music player and also to carry earphones connected to the music player by electrical cables. The wearer can, at his option, listen to music without obstructing surrounding sound by keeping the earphones tucked away in the hat near his ears; alternatively he can listen to music while obstructing surrounding sound by lowering the earphones and inserting them in his ears.

The hat can carry music players equipped with a clip as well as music not equipped with a clip. The hat has at least one pair of openings cut in its surface on each side. The first opening is configured to allow the insertion of a music player attachment clip thereby permitting the attachment of the music player to the hat. The second opening is located near the first opening and is configured to allow the passage of electrical cables connecting the music player to the earphones. For example, one pair of such opening can be located on the right, and another pair on the left, of the hat.

The hat also comprises a headband loosely attached to the inside surface of the hat. The headband is affixed at its bottom edge by a seam around the inside surface of the hat at its rim, except above the ears of the wearer where the seam is left open. This opening is configured to allow the passage of the earphones. The headband is also attached by stitch points at its top edge to the inside surface of the hat. The headband forms with the inside of the hat surface a conduit through which the cables can pass. The headband forms a retainer area above the ears of the wearer, configured to hold the earphones. The user can, at his option, listen to music without obstructing surrounding sound by leaving the earphones tucked away between the headband and the inner surface of the hat, or listen to music while blocking surrounding sounds by lowering the earphones through the seam openings and inserting them in his ears.

Many variations are possible. For example the openings can be in the shape of button holes. The one configured to hold the music player clip can be horizontal and the one configured to allow passage of the cables can be vertical. An openings pair can be located on the left side of the hat and a similar pair can be located on the right side of the hat.

Another variation involves indenting grooves on the bill, with the grooves shaped to receive the clip of the music player.

Yet another variation involves sewing elastic bands on the hat to hold the music player and the earphones. For example the elastic bands could be inserted through button holes and sewn on the inside of the hat, to permit the passage of cables from the outside of the hat to the inside. Elastic bands could be placed underneath the bill to hold the music player.

When the hat is in the shape of a cowboy hat and comprises an internal lining, openings would have to be made in the lining to allow the passage of electrical cables.

Because of the high value of the music player carried on the hat, a lanier can be mounted on the hat. To prevent theft or loss of the hat, the user can simply attach the lanier to himself or herself.

This invention also addresses itself to a method of listening to music which allows, at the user's option, the choice of not obstructing surrounding sound by keeping the earphones stowed away in the retainers between the headband and the hat, or of blocking out surrounding sound, by lowering the earphones and inserting them in his or her ears.

DETAILED DESCRIPTION

FIG. 1 shows how the invention is used. The preferred implementation for the present invention comprises a cap 1 specifically designed to accommodate a modern miniature music player 2 such as a Nanopod™ or an Ipod (also known as Shuffle™) which are typically connected to earphones 3. Even though the FIG. 1 depicts an Ipod™, it is understood that this invention can be used in conjunction with any compact music player.

Figure 2:
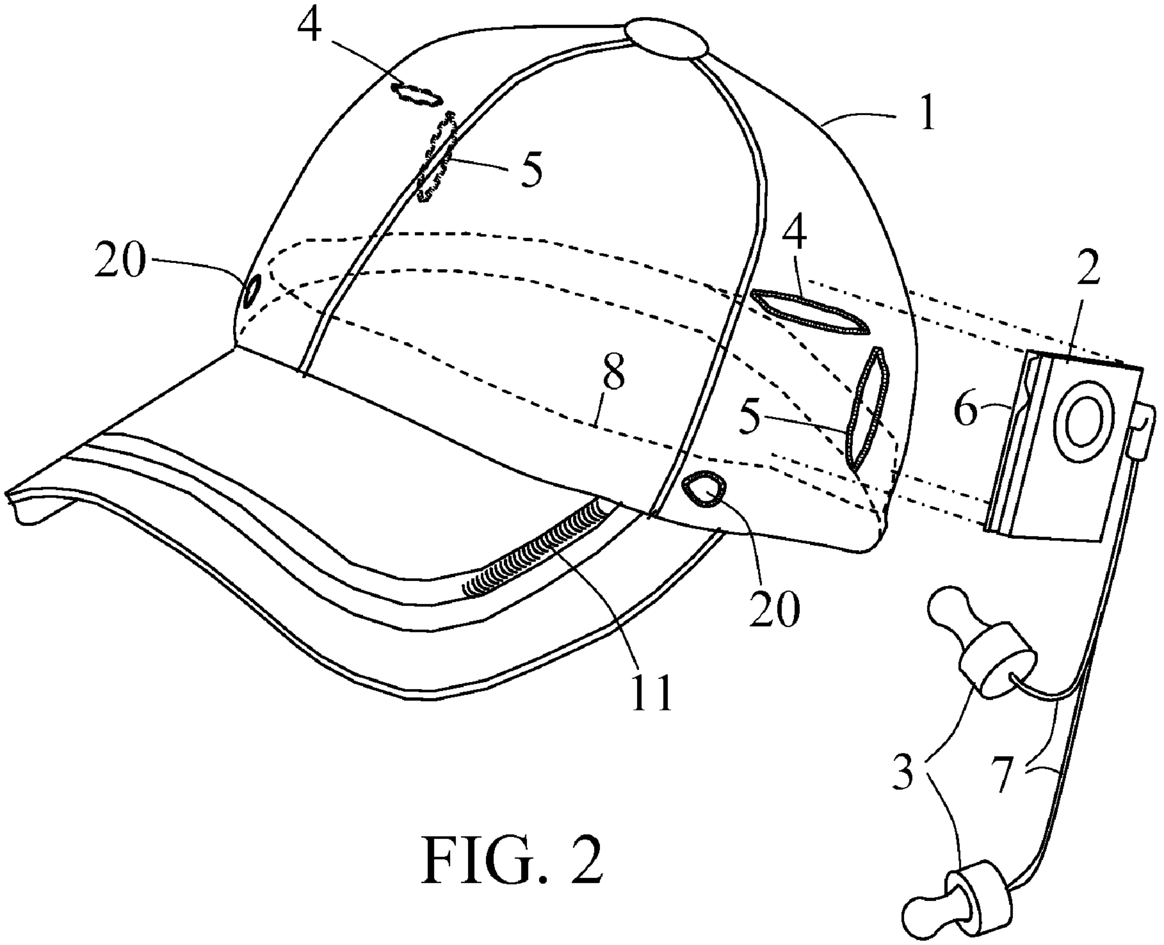
FIG. 2 is an exploded view of FIG. 1, showing the button holes used for attaching the music player.

FIG. 2 provides an exploded view of the invention showing the music player 2 separately from the cap 1. Specific features built into the cap to accommodate such a music player include:

a) Two openings 4 in the shape of button holes, typically located near the front right, or the front left of the cap 1. These button holes are essentially horizontal and just wide enough to accommodate the passage of the clip 6 of the music player 2, thereby facilitating the attachment of the music player 2. The reason for the button hole-shape is to facilitate the manufacture of the caps 1 and to appear least obtrusive when a music player is not worn with the cap.

b) Two openings 5 also in the shape of button holes, each located near one of the first pair of button holes. These button holes are essentially vertical and wide enough to accommodate the passage of cables 7 leading from the music player 2 clipped on the outside of the cap 1 to earphones 3 located on the inside of the cap 1.

Figure 3:
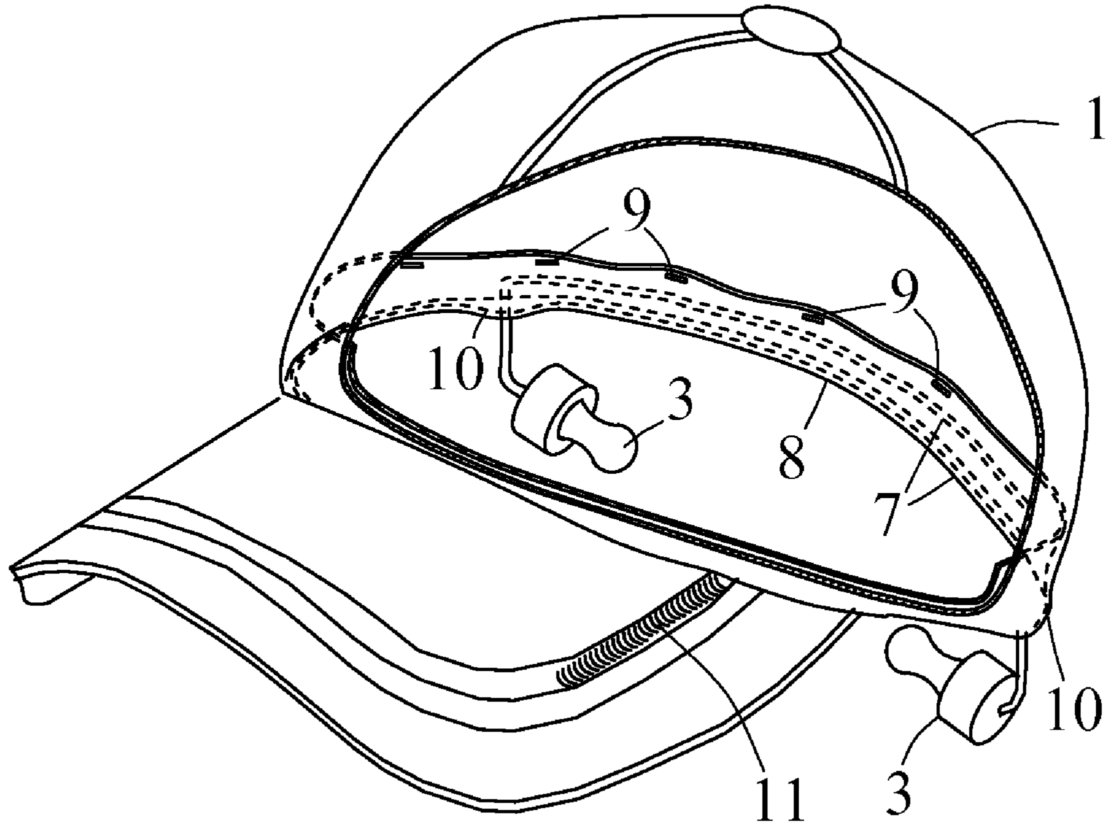
FIG. 3 shows how the headband can be used as a conduit for the cables between the music player and the earphones. This figure shows the earphones fully deployed.
Figure 4:
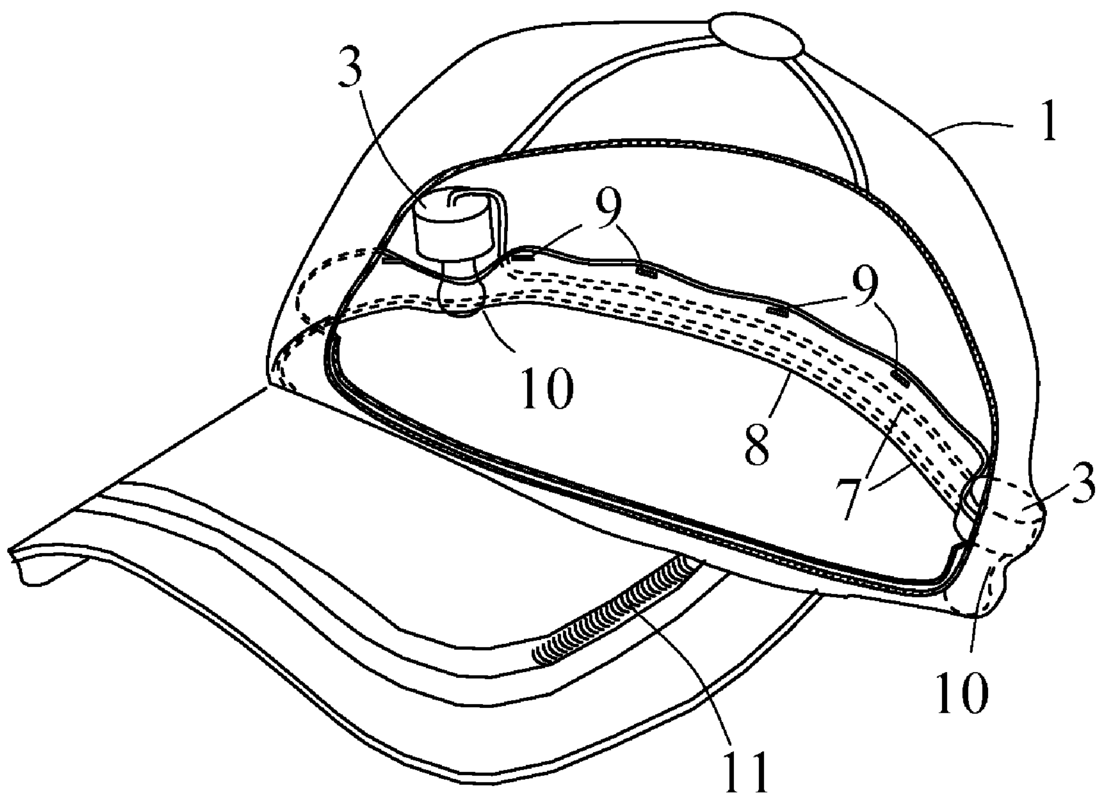
FIG. 4 describes how the earphones can be stowed away between the headband and the hat to provide unobstructed "background" music for the wearer.

Two openings 20 located near the front right and front left corners or the hat. These openings can be used to pass cables from the music player to the earphones.

c) A headband 8 which is firmly attached on its bottom side, to the cap 1. The top side of the headband 8, as shown in FIG. 3, is loosely attached to the cap 1 by means of tack points or stitch points 9. The rest of this description shall use the term "stitch point" to refer to both tack points and stitch points. This configuration allows the headband 8 to operate as a conduit for the cables 7. The cables run from the music player 2 through the button hole-openings 5 in the cap 1, through the passage between the headband 8 and the cap 1, through openings 10 between the bottom of the headband 8 and the cap 1, to a pair of earphones 3.

d) Earphones or earbuds 3 connected to the cables 7. As shown in FIG. 4, the earphones 3 can be stored between the headband 8 and the cap 1, in a space located above the ears of the user. The headband 8 is left unattached at this location so as to provide a passage and allow the earphones 3 to be lowered by the user. The headband forms between itself and the inner surface of the hat, two retaining areas above the ears of the user, allowing earphones to be stored there. When the hat is worn, the pressure between the headband and the inner surface of the hat is sufficient to keep the earphones in place.

To accommodate both right handed people and left handed people, identical button holes can be placed symmetrically on the other side of the hat 1.

The user has three options: 1) he may decide not to listen to music and keep the music player 2 off and the earphones 3 safely stowed in their place between the headband 8 and the cap 1 as shown in FIG. 4. 2) He may decide to listen to music in the background. To do this he turns on the music player 2 and leaves the earphones 3 tucked between the headband and the cap 1. The proximity of the earphones 3 to his ears allows the user to listen to music without obstructing sounds from his environment. This feature is important in view of laws that prohibit driving a car or riding a bike with earphones embedded in the ear and the obvious danger that such a practice would pose. 3) The user may decide to insert the earphones 3 in his ears. He retrieves the earphones through openings 10 between the headband 8 and the cap 1, and lowers them to his ears as indicated in FIGS. 1 and 3. After he is finished, he can then stow them away to their original place as in FIG. 4.

Several variations to this invention are possible.

Figure 5:
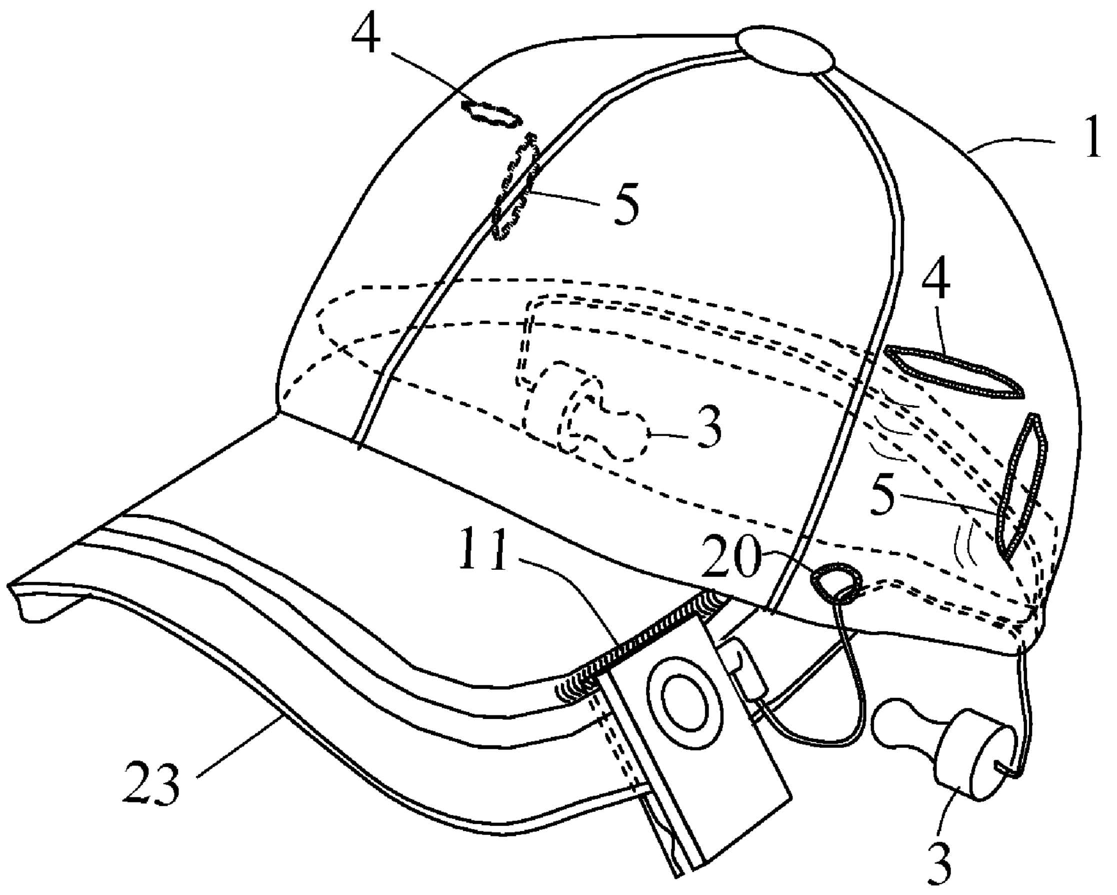
FIG. 5 depicts a configuration in which the music player is clipped on the bill of a cap. This configuration is used when a helmet is worn over a backward worn cap and is useful for preventing the music player from getting in the way of the helmet.

The cap can be configured to be worn under a hard helmet of the type carried by bicyclists or skateboarders. Typically when a cap is worn under a helmet, it is placed backward with the bill in the back toward the back of the head such that the bill does not interfere with the helmet. In such a configuration, the position of the music player must also be configured to avoid getting in the way of the helmet. As shown in FIG. 5, the music player 2 can be clipped to the bill 23. Secure attachment to the bill 23 can be achieved by indenting grooves 11 into the bill 23, into which the music player clip can be mounted. Button holes 20 can be provided in the cap above the bill to allow the passage of cables from the earphones 3 to the music player 2 mounted on the bill 23.

Figure 6:
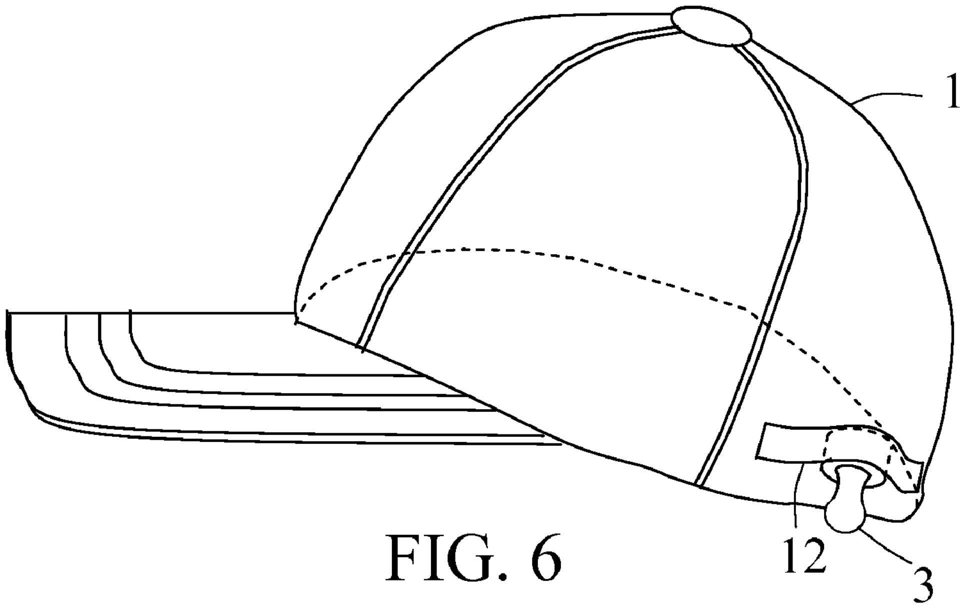
FIG. 6 shows how elastic bands sewn on the outside of the cap through button holes can be used to hold the earphones in place for storage or to provide "background" music.
Figure 6A:
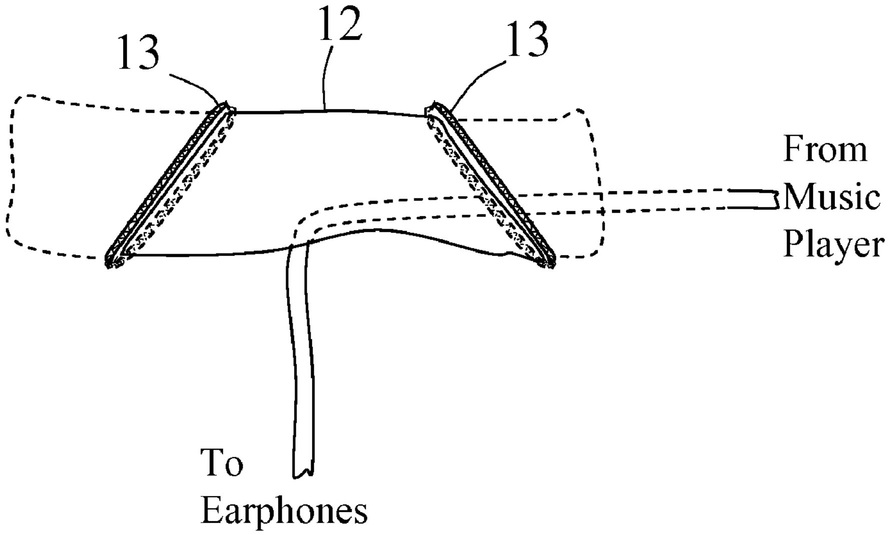
FIG. 6A provides a close up view of the elastic band used to attach the earphones.

Instead of stowing the earphones between the headband and the hat as shown in FIG. 3 and FIG. 4, they may be placed on the outside of the hat, held in place by bands 12 made of elastic fabric sewn or otherwise attached to the outside of the cap 1 as depicted in FIG. 6. A close up view of the elastic band 12 is provided in FIG. 6A, showing the button holes 13 through which the earphone cables 7 pass. According to this configuration, two holes are required through the cap 1 just above the ears, to allow passage of the cables 7 from the inside of the cap 1 to the outside.

Figure 7:
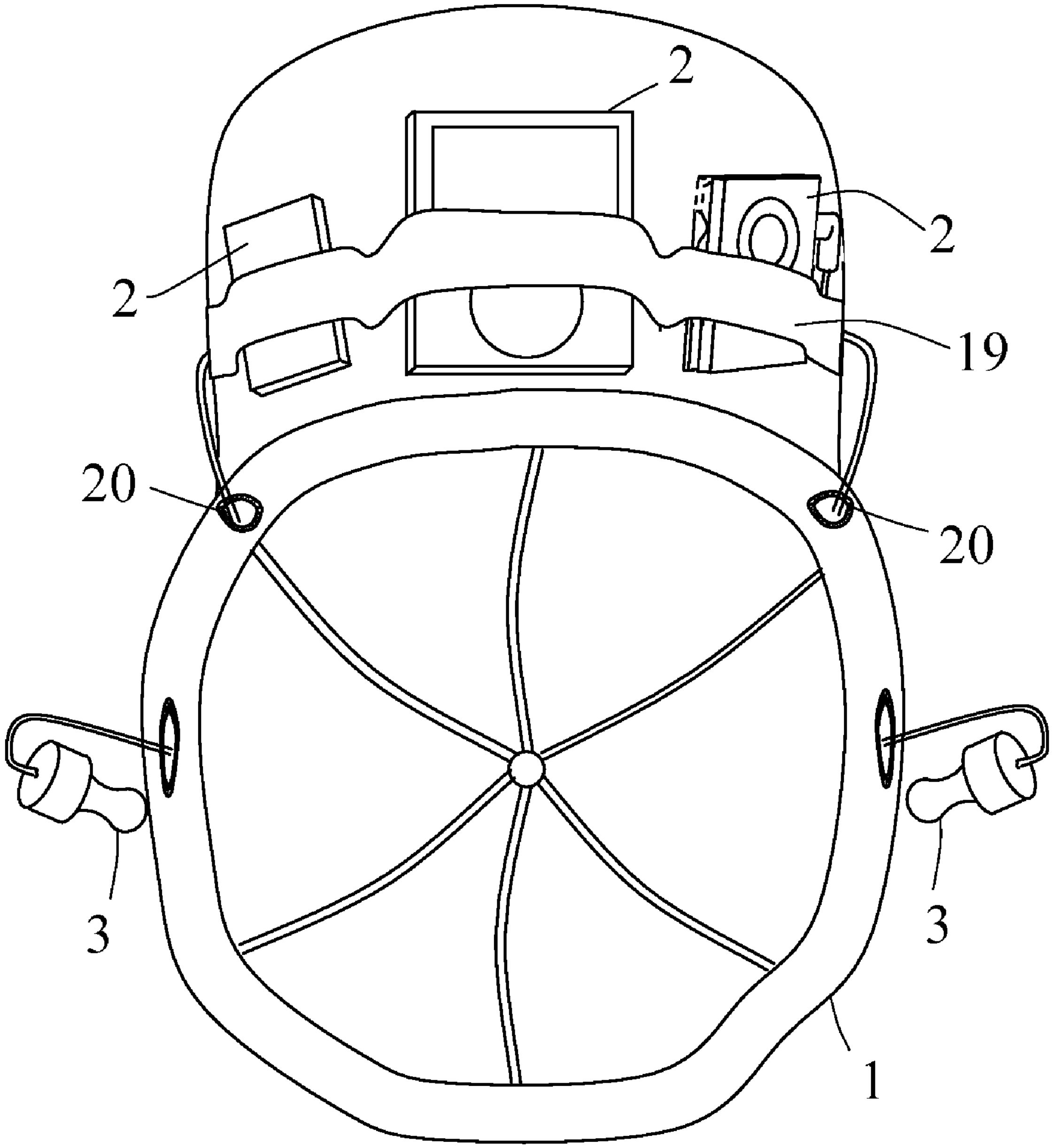
FIG. 7 shows how elastic bands placed on the bill can be used to hold the music source in place and to be configured to hold several different styles and size music players with or without attachment clips. It also conceals the music player so it is not so obvious and gives some protection from weather.

In addition, an elastic band 19 may be attached under the bill as shown in FIG. 7 to provide an attachment means for the music player 2. The elastic band 19 provides the user with a less obtrusive means for attaching his music player 2, accommodates several different size players and does not require the music player 2 to have a clip.

Other types of hats are possible including but not limited to visors, cowboy hats, and Stetsons™ Tilly™ hats, derbies and beanies.

Figure 8:
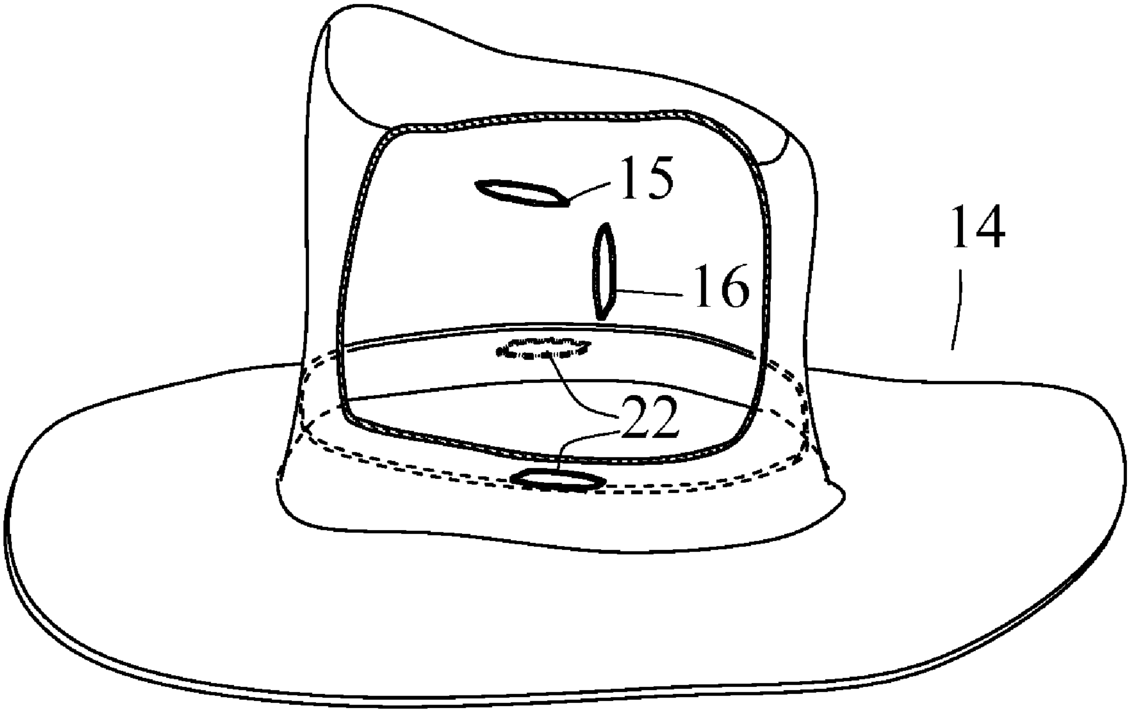
FIG. 8 illustrates a variation comprised of a Stetson™ hat or cowboy hat with a lining and can be configured to a more formal type of hat.

The music player may be mounted on the inside of the cap or hat, rather than on the outside. Such a configuration requires that the cap or hat incorporate a button hole-opening to allow the music player to be clipped on. If the hat has a lining, then the lining rather than the outside surface of the cap or hat should have a button hole-opening. FIG. 8 shows a cowboy hat 14 with a lining into which button holes 15, 16, 22 have been cut. For example button hole 15 could be used to insert the holding clip, button hole 16 can be used to pass the speaker cables from the inside of the hat to the outside, and button hole 22 can be used to access and store the earphones.

Figure 9:
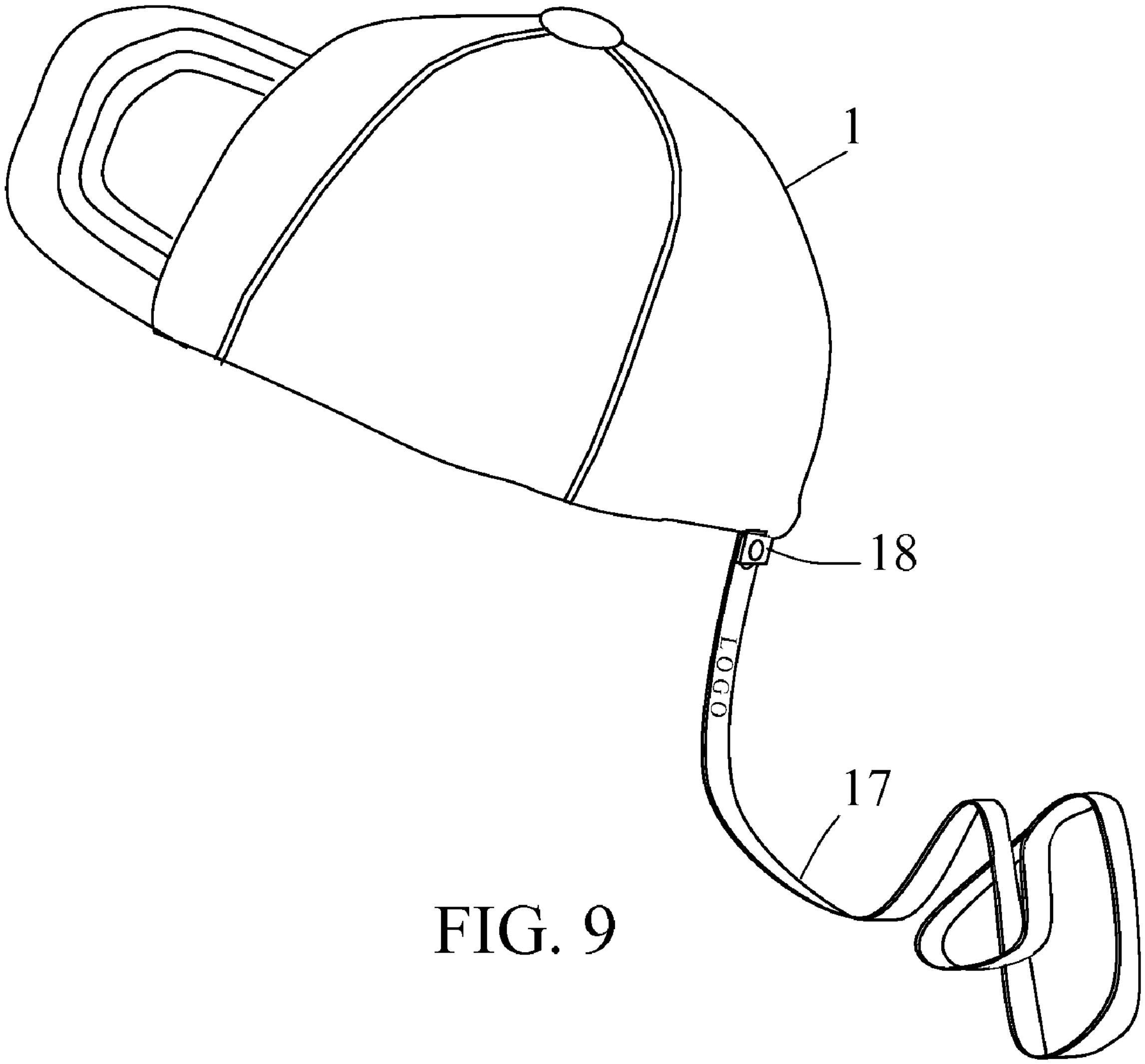
FIG. 9 depicts a cap with a security lanier.
Figure 10:
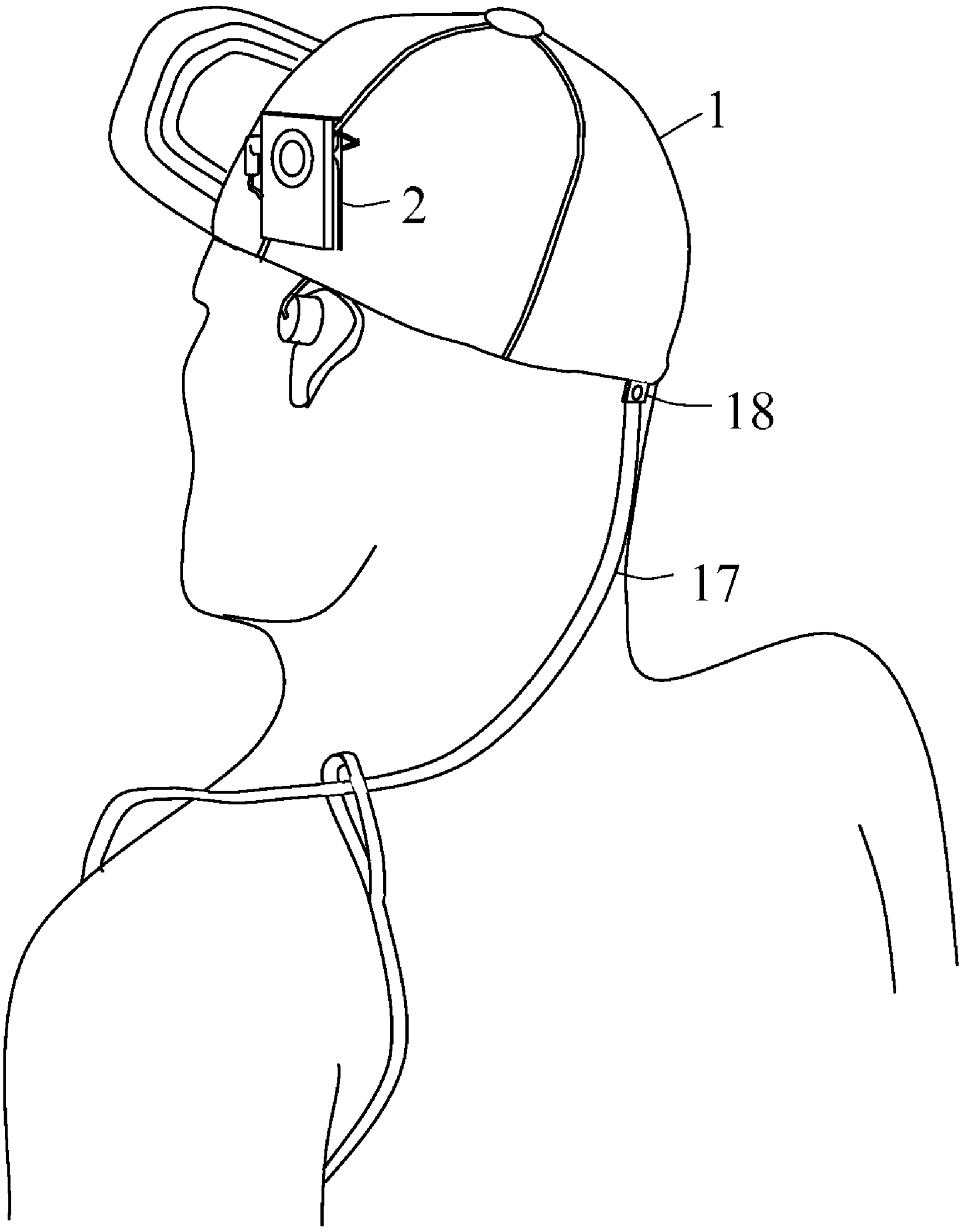
FIG. 10 shows how a cap with a lanier could be worn.

Loss of the hat to theft or to high wind also entails the loss of the expensive electronic equipment it carries. This possibility can be eliminated as shown in FIG. 9 by providing the cap 1 with a lanier 17 that can be attached to the user, for example around his arm and shoulder. The lanier 17 can be attached to the cap 1 by means of a snap lock mechanism 18 as depicted in FIG. 9 and FIG. 10.

Another variation includes providing the music player with short cables about 10 to 14 inches. While such short cables would be useless in the conventional use of a music player, in the particular application envisioned in this invention, their short length is an advantage as it prevents them from getting tangled in the hat and eliminates the need for "bunching up" the cables in separate pockets and removes the "bulge" of wire in the hat.

While the above description contains many specificities, the reader should not construe these as limitations on the scope of the invention, but merely as exemplifications of preferred embodiments thereof. Those skilled in the art will envision many other possible variations within its scope. Accordingly, the reader is requested to determine the scope of the invention by the appended claims and their legal equivalents, and not by the examples which have been given.

I claim:

1. A hat configured to carry a music player equipped with an attachment clip and also to carry earphones connected to said music player by electrical cables, said hat allowing a wearer having ears to listen to music without obstructing surrounding sound or to listen to music while obstructing surrounding sound comprising:

a) At least one pair of openings from the outside surface to the inside surface of said hat, i. first opening in each said pair configured to allow the insertion of said attachment clip of said music player, thereby allowing attachment of said music player to the outside of said hat; and ii. second opening in each said pair correspondingly located near first said opening, said second openings being configured to allow the passage, from the outside to the inside of said hat, of said electrical cables connecting said music player to said earphones; and b) a headband characterized by a top edge and a bottom edge, said headband being attached at its said bottom edge by a seam around the inside surface of said hat at its rim, except above the ears of said wearer thereby forming seam openings between said headband and said hat, said seam openings being configured to allow passage of said earphones, and furthermore said headband being attached by stitch points at its top edge to the inside surface of said hat, and in addition, said headband forming between itself and the inside surface of said hat a conduit, said conduit forming a retainer above the ears of said wearer, said a retainer configured to hold said earphones;

said cables from said music player enter the inside of said hat through the second said opening, follow said conduit formed by said headband, to said retainer and reach said earphones, whereby said wearer can listen to music without obstructing surrounding sound by leaving said earphones tucked away between said headband and said hat, or listen to music while blocking surrounding sounds by lowering said earphones through said seam openings and inserting them in said ears.

2. A hat as in claim 1 wherein said first opening in said pair is in the shape of a horizontal button hole.

3. A hat as in claim 1 wherein said second opening in said pair is in the shape of a vertical button hole.

4. A hat as in claim 1 wherein said first opening and said second opening are located on the left side of said hat, also comprising a third opening located on the right side of said hat, symmetrically with said first said opening, and a fourth opening located on the right side of said hat, symmetrically with said second said opening, wherein the left and right directions are taken with respect to said wearer.

5. A hat as in claim 1 in the shape of a cap, further comprising grooves indented on its bill, said grooves being configured to receive said clip of said music player.

6. A hat as in claim 1 further comprising bands of elastic fabric essentially rectangular in shape said hat also comprising, for each said elastic band, two button holes, each said elastic band, at each of its end, inserted through one of said button holes and sewn to the inside surface of said hat, and furthermore, said elastic bands configured to hold said earphones and said button holes configured to allow the passage of said electrical cables.

7. A hat as in claim 1 further comprising bands of elastic fabric essentially rectangular in shape said hat also comprising, for each said elastic band, two button holes, each said elastic band, at each of its end, inserted through one of said button holes and sewn to the inside surface of said hat, furthermore, and said elastic bands configured to hold said music player and said button holes configured to allow the passage of said electrical cables.

8. A hat as in claim 1 further comprising bands of elastic fabric essentially rectangular in shape and sewn at each end to the outside surface of said hat, and configured to hold a at least one music player.

9. A hat as in claim 8 in the shape of a cap, said cap having a bill, wherein said bands are located underneath said bill.

10. A hat as in claim 1, further comprising bands of elastic fabric sewn at their ends to said hat, said bands forming a retaining area configured for storing said earphones.

11. A hat as in claim 1 in the shape of a cowboy hat and comprising an internal lining, wherein first said opening and second said opening are located in said lining.

12. A hat as in claim 1 further comprising a lanier for providing a secure means for attaching said hat to said wearer, said lanier firmly affixed to said hat, and said lanier also being configured to be securely attached to said wearer.

13. A method of listening to music, which does not obstruct surrounding sound, utilizing the hat of claim 1 comprising the steps of a) turning on said music player; and b) stowing earphones away in said retainers between said headband and said hat.

14. A method of listening to music, utilizing the hat of claim 1 comprising the steps of c) turning on said music player, and d) lowering said earphones from said retainers between said headband and said hat through said seam openings, e) inserting said earphone into the ears.

* * * * *